US011300839B2

(12) United States Patent
Huang (10) Patent No.: US 11,300,839 B2
(45) Date of Patent: *Apr. 12, 2022

(54) DISPLAY PANEL AND DISPLAY DEVICE APPLYING THE SAME (71) Applicant: HKC Corporation Limited, Guangdong (CN)

(72) Inventor: Beizhou Huang, Chongqing (CN)

(73) Assignee: HKC Corporation Limited, Shenzhen (CN)

( * ) Notice: Subject to any disclaimer, the term of this patent is extended or adjusted under 35 U.S.C. 154(b) by 101 days.

This patent is subject to a terminal disclaimer.

(21) Appl. No.: 16/758,344

(22) PCT Filed: Dec. 13, 2017

(86) PCT No.: PCT/CN2017/115857
§ 371 (c)(1),
(2) Date: Apr. 22, 2020

(87) PCT Pub. No.: WO2019/080293
PCT Pub. Date: May 2, 2019

(65) Prior Publication Data
US 2020/0264467 A1  Aug. 20, 2020

(30) Foreign Application Priority Data
Oct. 26, 2017  (CN) .......................... 201711010957.4

(51) Int. Cl.
G02F 1/1345 (2006.01)
G02F 1/1362 (2006.01)
(Continued)

(52) U.S. Cl.
CPC ........ G02F 1/13452 (2013.01); G02F 1/1368 (2013.01); G02F 1/136286 (2013.01); H01L 27/124 (2013.01)

(58) Field of Classification Search
CPC ........... G02F 1/13452; G02F 1/136286; G02F 1/1368; G02F 1/1345; H01L 27/124
See application file for complete search history.

(56) References Cited

U.S. PATENT DOCUMENTS

2006/0146112 A1  7/2006 Kim
2008/0013029 A1  1/2008 Kim

FOREIGN PATENT DOCUMENTS

CN        1484067 A    3/2004
CN        1512251 A    7/2004
(Continued)

OTHER PUBLICATIONS

CN 1484067 A (Year: 2004).*

*Primary Examiner* — James A Dudek
(74) *Attorney, Agent, or Firm* — Muncy, Geissler, Olds & Lowe, P.C.

(57) ABSTRACT

A display panel and a display device using the same are provided. The display panel includes: a first substrate including a display area and a wiring area, wherein active switches and pixel units are disposed on the display area of the first substrate, and the pixel units are coupled to the active switches, respectively; a second substrate disposed opposite the first substrate; a first drive line portion disposed in the wiring area and including first circuit leads; a second drive line portion disposed in the wiring area and including second circuit leads; and a first interface unit disposed between the first drive line portion and the second drive line portion. The first interface unit connects the first circuit leads to the second circuit leads, respectively, and the second drive line portion is electrically coupled to the first drive line portion to form a parallel circuit.

19 Claims, 12 Drawing Sheets (51) Int. Cl.
*G02F 1/1368* (2006.01)
*H01L 27/12* (2006.01)

(56) References Cited

FOREIGN PATENT DOCUMENTS

| | | |
|---|---|---|
| CN | 101673016 A | 3/2010 |
| CN | 104216182 A | 12/2014 |

* cited by examiner

DISPLAY PANEL AND DISPLAY DEVICE APPLYING THE SAME

BACKGROUND

Technical Field

This disclosure relates to a circuit structure of a display, and more particularly to a wire on array (WOA) of a display panel and a display device applying the same.

Related Art

Recently, liquid crystal displays (LCDs) have the wide applications. With the improvement of the driving technology, the LCD has advantages of the low electrical power consumption, the thin and light properties, the low voltage driving property and the like. At present, the LCD has been widely applied to the video recorder/player, notebook computer, desktop display and various projection apparatuses.

When the panel of the active switch-liquid crystal display (or TFT-LCD) is normally displaying, a gate driver needs to be combined with a gate line, a source driver needs to be combined with a data line and to work in conjunction with a color filter common electrode (CF Com) and a storage electrode. A pixel electrode signal is supplied through the data line after the active switch (TFT) turns on. A storage electrode signal is supplied from an array common line (AA Com) around an effective display area to form a storage capacitor (Cst) between it and the pixel electrode. A color filter common electrode signal is supplied from a common voltage line of the wire on array (WOA) of the array substrate to the color filter substrate. A liquid crystal capacitor (Clc) is formed between the color filter common electrode and the pixel electrode.

In order to save the cost, the circuits including the gate driver, the gate lines and the data lines are formed on the same display substrate, and then the WOA is utilized to connect the display substrate to the chip on film (COF) for transmitting the gate drive signal. In general, the WOA includes: the type A trace for providing the common voltage to the color filter substrate; the type B trace for providing the power drive signal to the chip; and the type C trace for providing the work signal to the chip. However, a signal of the gate line is transferred to each layer of chip and integrated circuit (IC) in a layer-by-layer manner through the WOA. Thus, the power drive signal provided to the chip/integrated circuit through the type B trace cannot have the serious distortion. In the design, the resistance value of the type B trace for the chips/integrated circuits needs to be decreased.

However, with the requirement of the border of the display panel getting narrower and narrower, the WOA space is getting smaller and smaller, and this also makes the wiring spaces of the drive traces of the chips/integrated circuits become smaller and smaller, and the trace is getting thinner and thinner and longer and longer. The corresponding impedance value gets larger. Not only the drive signal gets distorted seriously, but also the display homogeneity of the display panel is affected.

SUMMARY

In order to solve the above-mentioned technical problems, an objective of this disclosure is to provide a wire on array (WOA) structure capable of decreasing the resistance value of the type B trace of the WOA in the narrow border, enhancing the product quality and the product reliability, and lengthening the lifetime.

The objective of this disclosure and the solution of the technical problem are implemented using the following technical solutions. The disclosure provides a display panel comprising: a first substrate including a display area and a wiring area, wherein a plurality of active switches and a plurality of pixel units are disposed on the display area of the first substrate, and the pixel units are coupled to the active switches, respectively; a second substrate disposed opposite the first substrate; a first drive line portion disposed in the wiring area of the first substrate and including a plurality of first circuit leads; a second drive line portion disposed in the wiring area of the first substrate and including a plurality of second circuit leads; and a first interface unit disposed between the first drive line portion and the second drive line portion. The first interface unit connects the first circuit leads to the second circuit leads, respectively, and the second drive line portion is electrically coupled to the first drive line portion to form a parallel circuit.

The solution of the technical problem of this disclosure can further be implemented using the following technological measures.

In one embodiment of the disclosure, the second drive line portion is electrically coupled to the first drive line portion through a single layer metal wiring or a dual layer metal wiring.

In one embodiment of the disclosure, the second drive line portion is electrically coupled to a plurality of virtual bit interface units and the first interface unit.

In one embodiment of the disclosure, the display panel further includes a third drive line portion electrically coupled to a plurality of virtual bit interface units to form a parallel circuit with the first drive line portion.

In one embodiment of the disclosure, the virtual bit interface units are provided by way of a single layer metal wiring or a dual layer metal wiring.

In one embodiment of the disclosure, the first circuit leads are connected to a drive chip.

In one embodiment of the disclosure, the drive chip is a source drive chip.

In one embodiment of the disclosure, the drive chip is a gate drive chip.

In one embodiment of the disclosure, the display panel further includes: a fourth drive line portion disposed in the wiring area of the first substrate; and a flexible circuit board including a first wire electrically coupled to the first drive line portion and the fourth drive line portion.

In one embodiment of the disclosure, the flexible circuit board further includes a second wire, wherein the second wire and the first wire are connected in parallel to form parallel wires.

In one embodiment of the disclosure, the second wire is electrically coupled to the virtual bit interface units and a first interface unit.

In one embodiment of the disclosure, the flexible circuit board is a flexible printed circuit film or a flexible printed circuit board.

In one embodiment of the disclosure, the display panel further includes: a fourth drive line portion disposed in the wiring area of the first substrate; and a flexible circuit board including a first wire and a second wire. The first wire and the second wire are connected in parallel to form a parallel circuit, and the first interface unit electrically couples the first drive line portion and the fourth drive line portion to the virtual bit interface units.

In one embodiment of the disclosure, the third drive line portions are respectively electrically coupled to the a plurality of virtual bit interface units to form parallel circuits with the first drive line portion and the fourth drive line portion, respectively.

In one embodiment of the disclosure, the display panel further includes: the fourth drive line portion disposed in the wiring area of the first substrate; and the flexible circuit board including the first wire and the second wire. The second wire and the first wire are connected in parallel to form parallel wires, the first wire is electrically coupled to the first drive line portion and the fourth drive line portion. The first drive line portion and the fourth drive line portion are respectively electrically coupled to the second drive line portion and the virtual bit interface units through the first interface unit. The second drive line portion is electrically coupled to and between the virtual bit interface units.

In one embodiment of the disclosure, the third drive line portion is electrically coupled to the virtual bit interface units to form parallel circuits with the first drive line portion and the fourth drive line portion.

This disclosure also provides another display panel including: a first substrate including a display area and a wiring area, wherein a plurality of active switches and a plurality of pixel units are disposed on the display area of the first substrate, and the pixel units are coupled to the active switches, respectively; a second substrate disposed opposite the first substrate; a first drive line portion disposed in the wiring area of the first substrate and including a plurality of first circuit leads, wherein the first circuit leads are extendingly arranged in a direction toward an edge of the first substrate; a second drive line portion disposed in the wiring area of the first substrate and including a plurality of second circuit leads, wherein the second circuit leads face and extend toward an inside of the first substrate and are arranged in a direction opposite to the first circuit leads; a first interface unit connected to the first circuit leads; and a virtual bit interface unit connected to the second circuit leads. The first interface unit connects the virtual bit interface unit, and the second drive line portion is electrically coupled to the first drive line portion to form a parallel circuit. The first drive line portion further comprises a first pair of bit marks connected to the first circuit leads, and the second drive line portion further comprises a second pair of bit marks connected to the second circuit leads. The first interface unit and the second drive line portion are electrically coupled to the first drive line portion by way of a single layer metal wiring or a dual layer metal wiring.

In one embodiment of the disclosure, a material of the first pair of bit markers and the second pair of bit markers is selected from a group consisting of aluminum, molybdenum, chromium and alloys thereof.

In one embodiment of the disclosure, a material of the first interface unit and the virtual bit interface unit is selected from a group consisting of aluminum, molybdenum, chromium and alloys thereof.

The disclosure further provides a display device including a control component and a display panel. The display panel includes: a first substrate including a display area and a wiring area, wherein a plurality of active switches and a plurality of pixel units are disposed on the display area of the first substrate, and the pixel units are coupled to the active switches, respectively; a second substrate disposed opposite the first substrate; a first drive line portion disposed in the wiring area of the first substrate and including a plurality of first circuit leads; a second drive line portion disposed in the wiring area of the first substrate and including a plurality of second circuit leads; and a first interface unit disposed between the first drive line portion and the second drive line portion. The first interface unit connects the first circuit leads to the second circuit leads, respectively, and the second drive line portion is electrically coupled to the first drive line portion to form a parallel circuit.

This disclosure is capable of decreasing the resistance value of the type B trace of the WOA in the narrow border, enhancing the product quality and the product reliability, and lengthening the lifetime.

DETAILED DESCRIPTION OF THE INVENTION

The embodiments of the invention will be apparent from the following detailed description, which proceeds with reference to the accompanying drawings, wherein the same references relate to the same elements.

In the description of this disclosure, it is to be understood that the terms "up", "down", "front", "back", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure.

In the drawings, the thickness of layers, films, panels, regions or the like is exaggerated for clarity. In the drawings, the thickness of some layers and regions is exaggerated for the sake of understanding and ease of description. It will be understood that when an element such as a layer, a film, a region or a substrate is referred to as being "on" another element, the element may be directly on another element, or an intermediate element may also be present therebetween.

In addition, the word "including" is to be understood to mean the inclusion of such elements, but do not exclude any other elements, unless expressly stated to be contrary. In addition, in the specification, the word "on" means that it is located above or below the target group assembly and is not meant to be on the top of the gravitational direction.

In order to further illustrate the technical means and effects of the present application for achieving the intended purpose of this disclosure, a display panel and a display device applying the same according to this disclosure will be described below with reference to the accompanying drawings and embodiments, wherein the implementations, structures, features and their effects will be described in detail in the following.

Figure 1A:
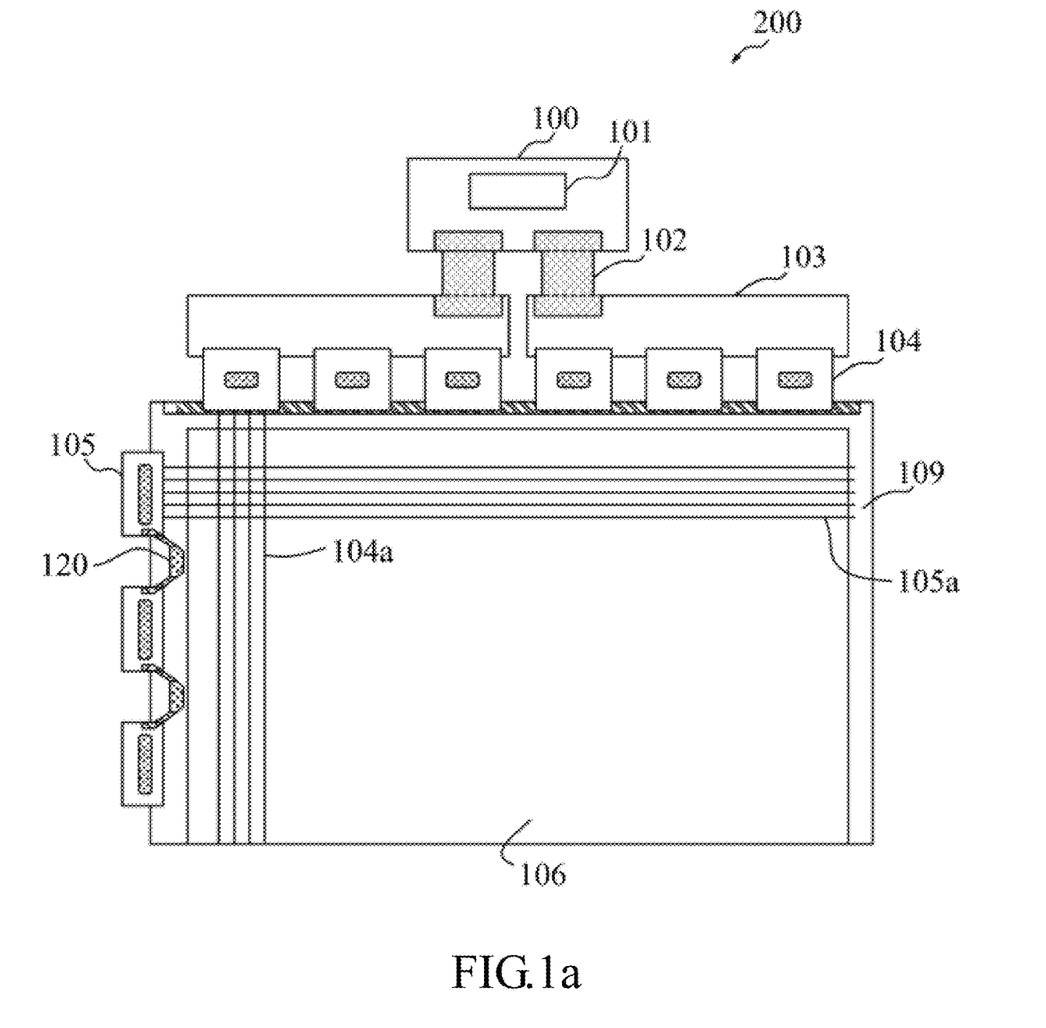
FIG. 1a is a schematic architecture view showing an exemplary display device.

FIG. 1a is a schematic architecture view showing an exemplary display device. Referring to FIG. 1a, a display device 200 includes: a control board 100, which includes a timing controller (TCON) 101; a printed circuit board 103 connected to the control board 100 through a flexible flat cable (FFC) 102; a source driving unit 104 and a gate driving unit 105, which are disposed in a wiring area 109 and connected to a data line 104a and a gate line 105a inside a display area 106, respectively. In some embodiments, the gate driving unit 105 and the source driving unit 104 include, but without limitation to, a COF form.

The drive mode of the display device 200 includes providing, by a system mainboard, a color (such as R/G/B) compression signal, a control signal and a power transmitted to the control board 100. After the timing controller (TCON) 101 on the control board 100 processes these signals, the processed signals are transmitted to the gate driving unit 105 and the source driving unit 104 of the printed circuit board 103 together with the power processed by the drive circuit through the FFC 102. The gate driving unit 105 and the source driving unit 104 transmit the necessary data and power to the display area 106, so that the display device 200 obtains the power and the signal required for displaying the frame.

Figure 1B:
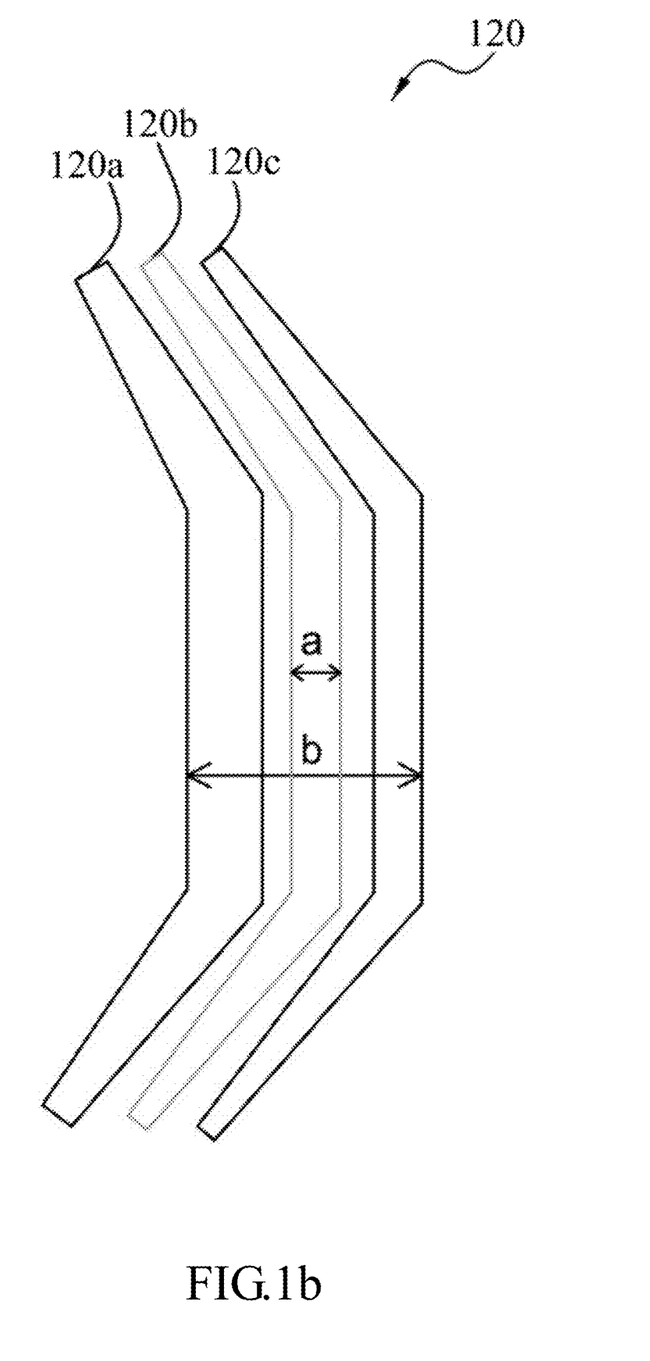
FIG. 1b is a schematic trace view showing an exemplary wire array.

FIG. 1b is a schematic trace view showing an exemplary wire array. The understanding is facilitated with reference to FIG. 1a. In some embodiments, the circuits, such as the driving units (104, 105), the gate line 105a and the data line 104a and the like, are formed on the same display substrate. The display substrate and the driving units (104, 105) for transmitting the drive signal are connected together by using the WOA 120. In general, the WOA 120 includes: a type A trace 120a for transmitting the common voltage; a type B trace 120b for supplying a power drive signal to a chip; and a type C trace 120c for supplying a work signal to the chip.

Figure 1C:
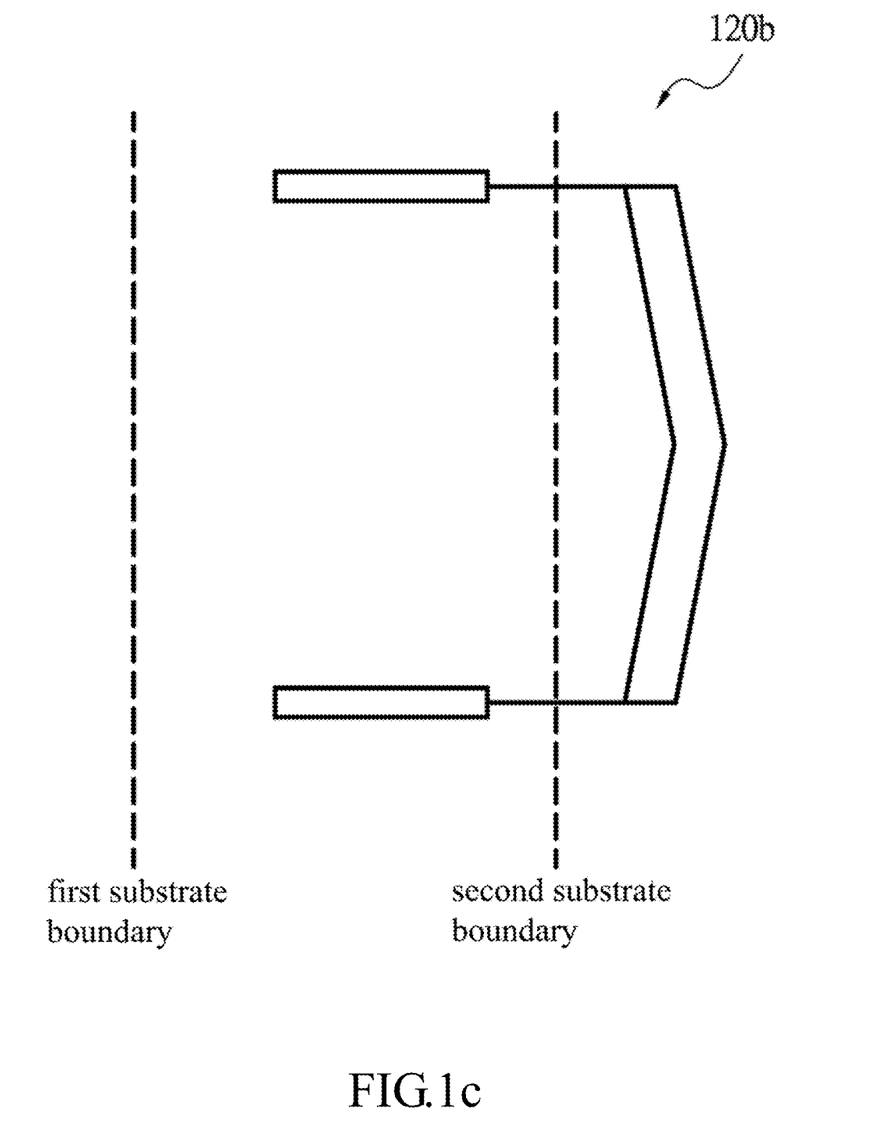
FIG. 1c is a schematic view showing the type B trace in the exemplary wire array.

FIG. 1c is a schematic view showing the type B trace in the exemplary wire array. Referring to FIG. 1c, which shows the WOA structure (type B trace 120b) of the exemplary display panel, which includes a plurality of drive line portions (type B traces 120b), and each of the drive line portions includes a plurality of circuit leads and interface units.

However, a signal of the gate line 105a is transferred to each layer of the chip and integrated circuit (IC) of the gate driving unit 105 in a layer-by-layer manner through the WOA 120. Thus, the power drive signal provided to the chip/integrated circuit through the type B trace 120b cannot have the serious distortion. In the actual use, however, since the WOA 120 between the gate driving units 105 (such as Gate to Gate, G-G) has an impedance, the longer the WOA 120 is, the greater the corresponding impedance value is, and this will show the signal climbing and amplitude. So in the design, the resistance value of the type B trace 120b for the chips/integrated circuits needs to be decreased.

Figure 2A:
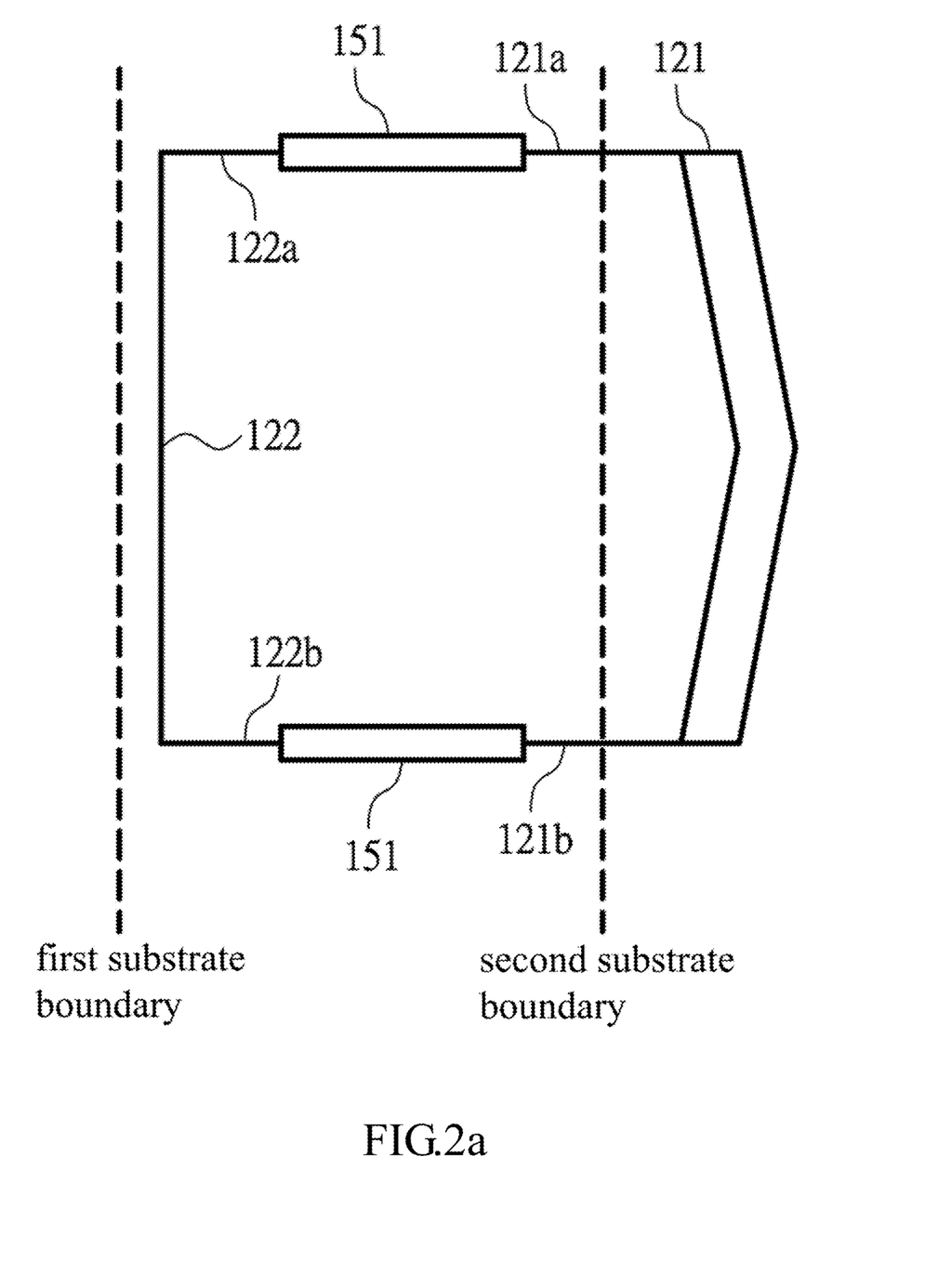
FIG. 2a is a schematic design view showing the type B trace of the display panel working in conjunction with the trace of the flexible circuit board according to an embodiment of this disclosure.

FIG. 2a is a schematic design view showing the type B trace of the display panel working in conjunction with the trace of the flexible circuit board according to an embodiment of this disclosure. Referring to FIG. 2a, in an embodiment of this disclosure, a display panel includes: a first substrate (not shown) including a display area and a wiring area, wherein a plurality of active switches and a plurality of pixel units are disposed on the display area of the first substrate, and the a plurality of pixel units are coupled to the a plurality of active switches, respectively; a second substrate (not shown) disposed opposite the first substrate; a first drive line portion 121 disposed in the wiring area of the first substrate and including a plurality of first circuit leads (121a, 121b); a second drive line portion 122 disposed in the wiring area of the first substrate and including a plurality of second circuit leads (122a, 122b); and a first interface unit 151 disposed between the first drive line portion and the second drive line portion; wherein the first interface unit 151 connects the first circuit leads (121a, 121b) to the second circuit leads (122a, 122b), respectively; wherein the second drive line portion 122 is electrically coupled to the first drive line portion 121 to form the parallel circuits.

In one embodiment, the first drive line portion 121 further includes the first pair of bit marks (not shown) connected to the first circuit leads (121a, 121b).

In one embodiment, the second drive line portion 122 further includes the second pair of bit marks (not shown) connected to the second circuit leads (122a, 122b).

In one embodiment, the material of the first pair of bit markers is selected from the group consisting of aluminum, molybdenum, chromium and alloys thereof.

In one embodiment, a material of the second pair of bit markers is selected from a group consisting of aluminum, molybdenum, chromium and alloys thereof.

In one embodiment, the materials of the first interface unit 151 and a virtual bit interface unit 153 (FIG. 2b) is selected from the group consisting of aluminum, molybdenum, chromium and alloys thereof.

Figure 5:
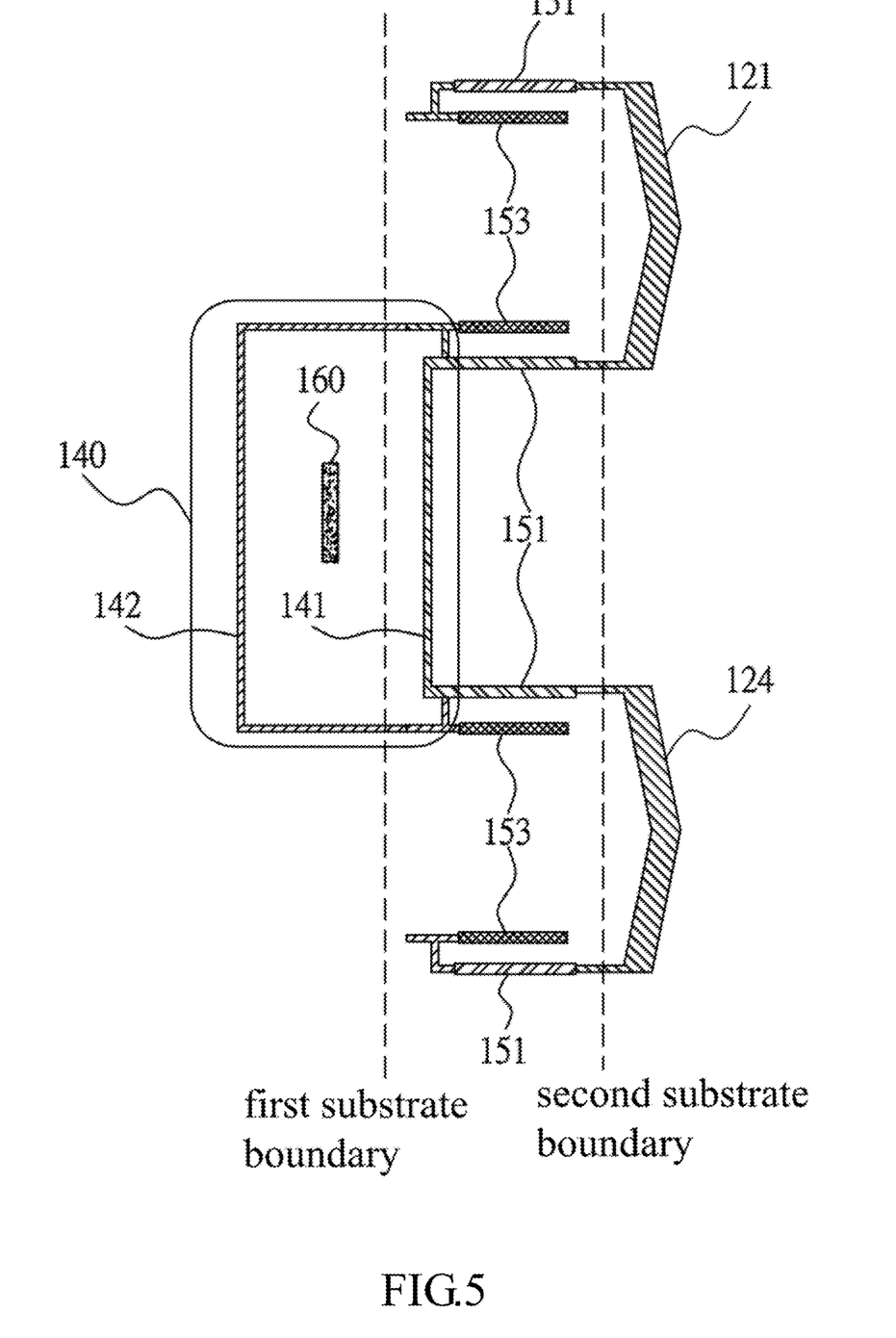
FIG. 5 is a schematic design view showing the type B trace of the display panel working in conjunction with the trace of the flexible circuit board according to an embodiment of this disclosure.

In one embodiment, the first circuit leads (121a, 121b) are connected to a drive chip (160, FIG. 5).

In one embodiment, the drive chip 160 is a source drive chip.

In one embodiment, the drive chip 160 is a gate drive chip.

In one embodiment, the second drive line portion 122 is electrically coupled to the first drive line portion 121 through the single layer metal wiring. This configuration enables a display panel in the normal display to prevent the influence of the outer frame or air to the maximum extent.

In one embodiment, the second drive line portion 122 is electrically coupled to the first drive line portion 121 by using the dual layer metal wiring. This configuration can result in a maximum reduction in the resistance value of the wire array.

Figure 2B:
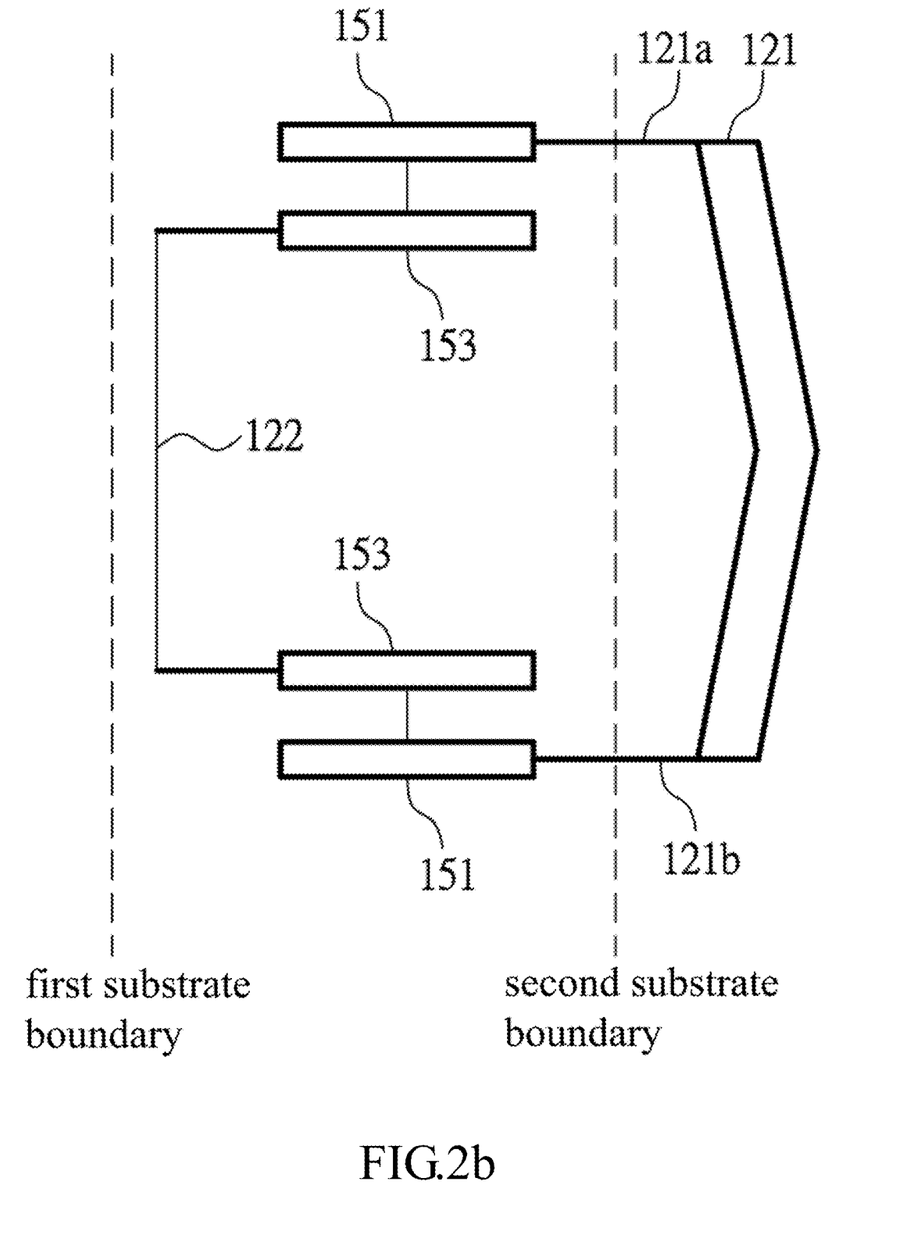
FIG. 2b is a schematic design view showing the type B trace of the display panel working in conjunction with the trace of the flexible circuit board according to an embodiment of this disclosure.

FIG. 2b is a schematic design view showing the type B trace of the display panel working in conjunction with the trace of the flexible circuit board according to an embodiment of this disclosure. In one embodiment of this disclosure, a display panel includes: a first substrate (not shown), wherein a plurality of active switches and a plurality of pixel units are disposed on the first substrate; a second substrate (not shown) disposed opposite the first substrate; a first drive line portion 121 disposed in the wiring area of the first substrate and including a plurality of first circuit leads (121a, 121b), wherein the first circuit leads (121a, 121b) are extendingly arranged in a direction toward the edge of the first substrate; a second drive line portion 122 disposed in the wiring area of the first substrate and including a plurality of second circuit leads (122a, 122b), wherein the second circuit leads (122a, 122b) face the inside of the first substrate and are arranged in a direction opposite to the first circuit leads (121a, 121b); a first interface unit 151 connected to the first circuit leads (121a, 121b); and a virtual bit interface unit 153 connected to the second circuit leads (122a, 122b), respectively. The first interface unit 151 is connected to the virtual bit interface unit 153, so that the second drive line portion 122 is electrically coupled to the first drive line portion 121 to form the parallel circuits. The first drive line portion 121 further includes the first pair of bit markers connected to the first circuit leads 121a and 121b. The second drive line portion 122 further includes the second pair of bit marks connected to the second circuit leads 122a and 122b. The edge the second drive line portion 122 has an active switch array.

Figure 3:
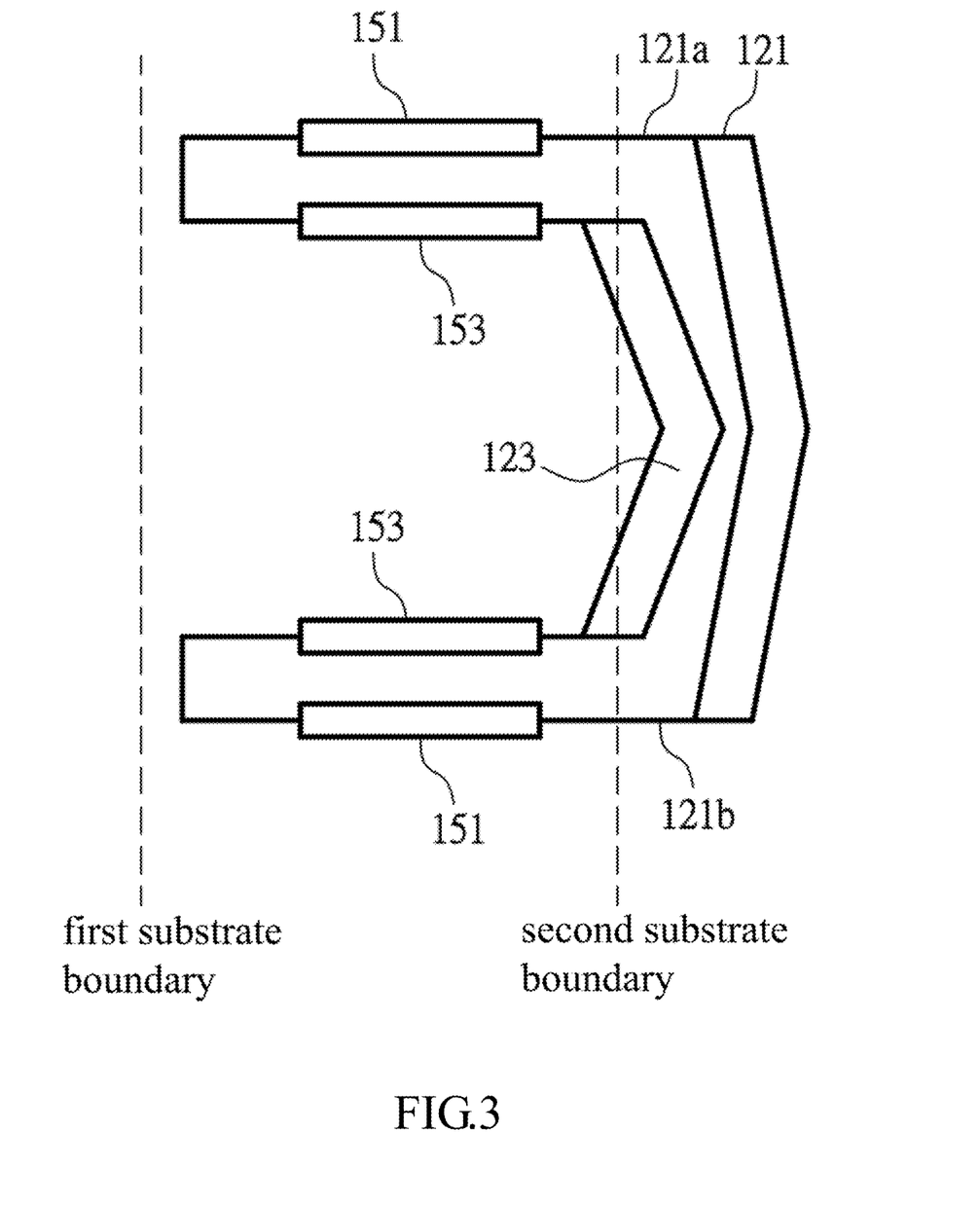
FIG. 3 is a schematic design view showing the type B trace of the display panel working in conjunction with the trace of the flexible circuit board according to an embodiment of this disclosure.

FIG. 3 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a first drive line portion 121 disposed in the wiring area, wherein the first drive line portion 121 is electrically coupled to the virtual bit interface units 153 through the first interface unit 151; and a third drive line portion 123 respectively electrically coupled to the virtual bit interface units 153 to form the parallel circuits with the first drive line portion 121.

Figure 4:
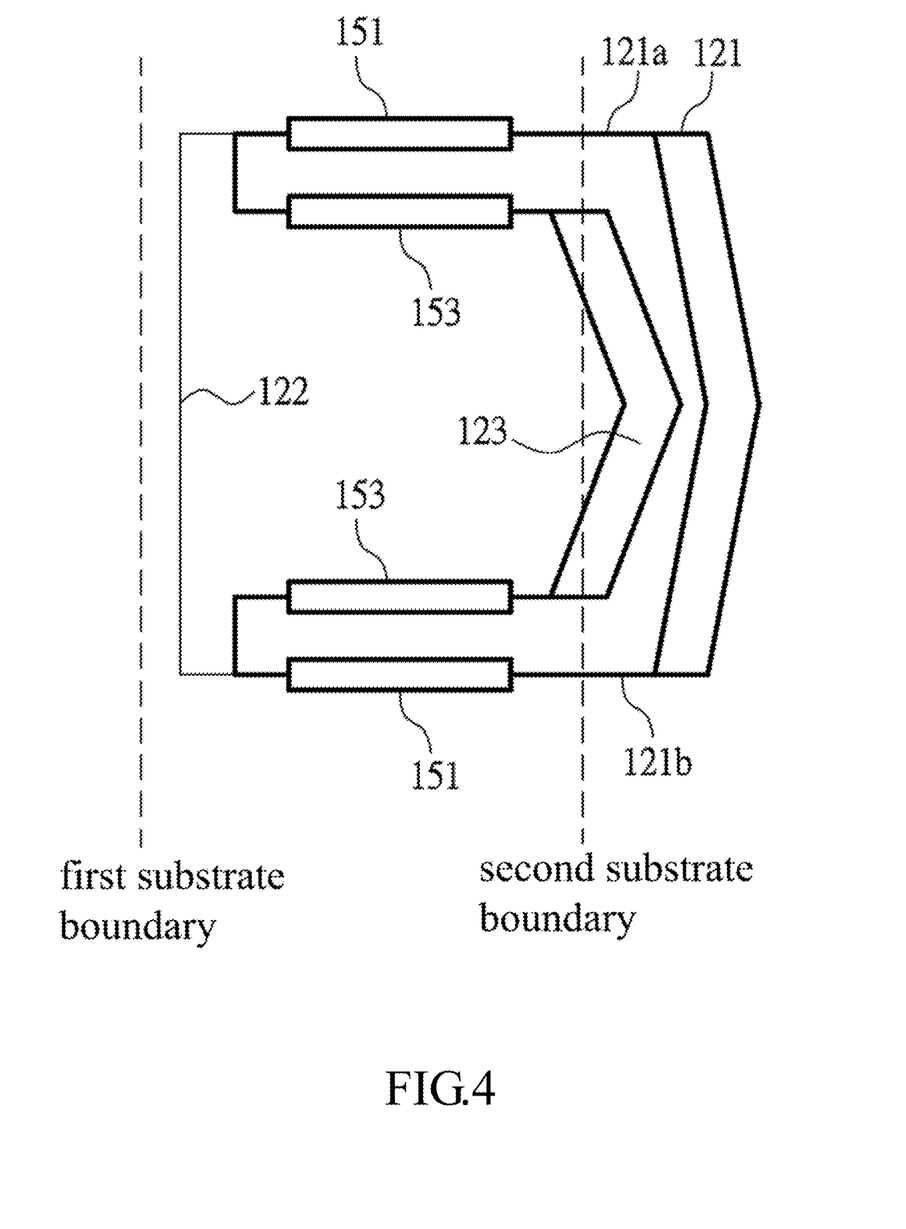
FIG. 4 is a schematic design view showing the type B trace of the display panel working in conjunction with the trace of the flexible circuit board according to an embodiment of this disclosure.

FIG. 4 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a first drive line portion 121 and a second drive line portion 122 disposed in the wiring area, wherein the second drive line portion 122 is electrically coupled to the virtual bit interface units 153 and first interface unit 151, respectively, and the first drive line portion 121 is electrically coupled to the first interface units 151; and a third drive line portion 123 respectively electrically coupled to the virtual bit interface units 153 to form the parallel circuits with the first drive line portion 121.

In some embodiments, the second drive line portion 122, the first interface unit 151 and the virtual bit interface units 153 are provided by way of a single layer metal wiring or a dual layer metal wiring.

FIG. 5 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a second substrate disposed corresponding to the first substrate; a first drive line portion 121 and a fourth drive line portion 124 disposed in the wiring area of the first substrate; and a flexible circuit board 140 including a first wire 141 electrically coupled to the first drive line portion 121 and the fourth drive line portion 124. The flexible circuit board 140 includes a second wire 142, and the second wire 142 is connected to the first wire 141 to form parallel wires. Thus, the parallel wires function as the extension wires of the first drive line portion 121 and the fourth drive line portion 124 to expand the line widths and areas among three of them. In addition, the resistance value of the drive line portion can be relatively reduced according to the parallel impedance principle of the parallel wires.

In some embodiments, the flexible circuit board 140 represents a flexible printed circuit film or a flexible printed circuit board.

In some embodiments, the second wire 142 is electrically coupled to the virtual bit interface units 153 and the first interface units 151.

Figure 6:
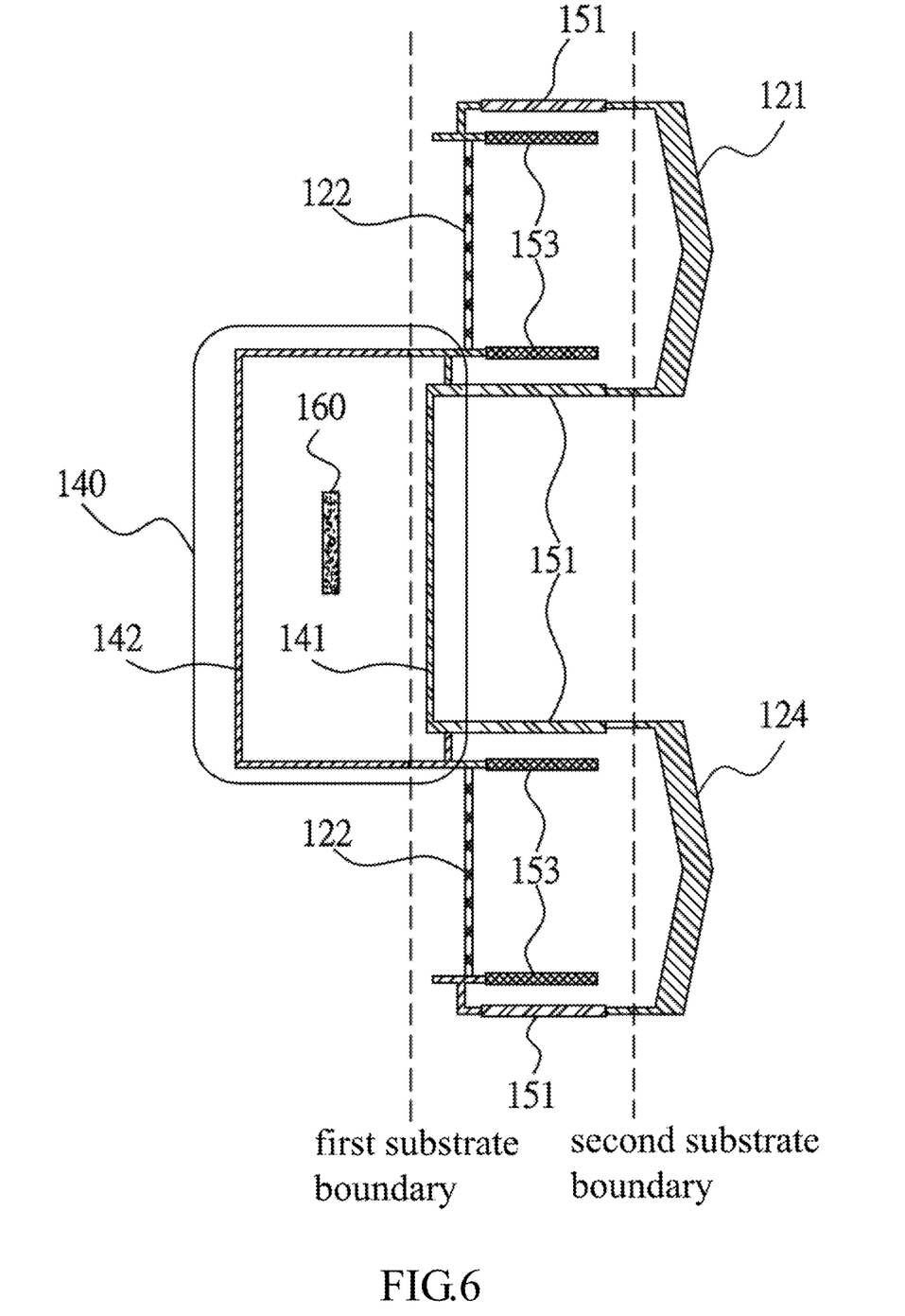
FIG. 6 is a schematic design view showing the type B trace of the display panel working in conjunction with the trace of the flexible circuit board according to an embodiment of this disclosure.

FIG. 6 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a second substrate disposed corresponding to the first substrate; a first drive line portion 121, a second drive line portion 122 and a fourth drive line portion 124 disposed in the wiring area of the first substrate; a first interface unit 151 connected to the first drive line portion 121 and the second drive line portion 122; and a flexible circuit board 140 including a first wire 141 and a second wire 142. The first drive line portion 121 and the fourth drive line portion 124 are electrically coupled together through the first wire 141, and the second wire 142 is connected to the first wire 141 in parallel to form the parallel wires.

Figure 7:
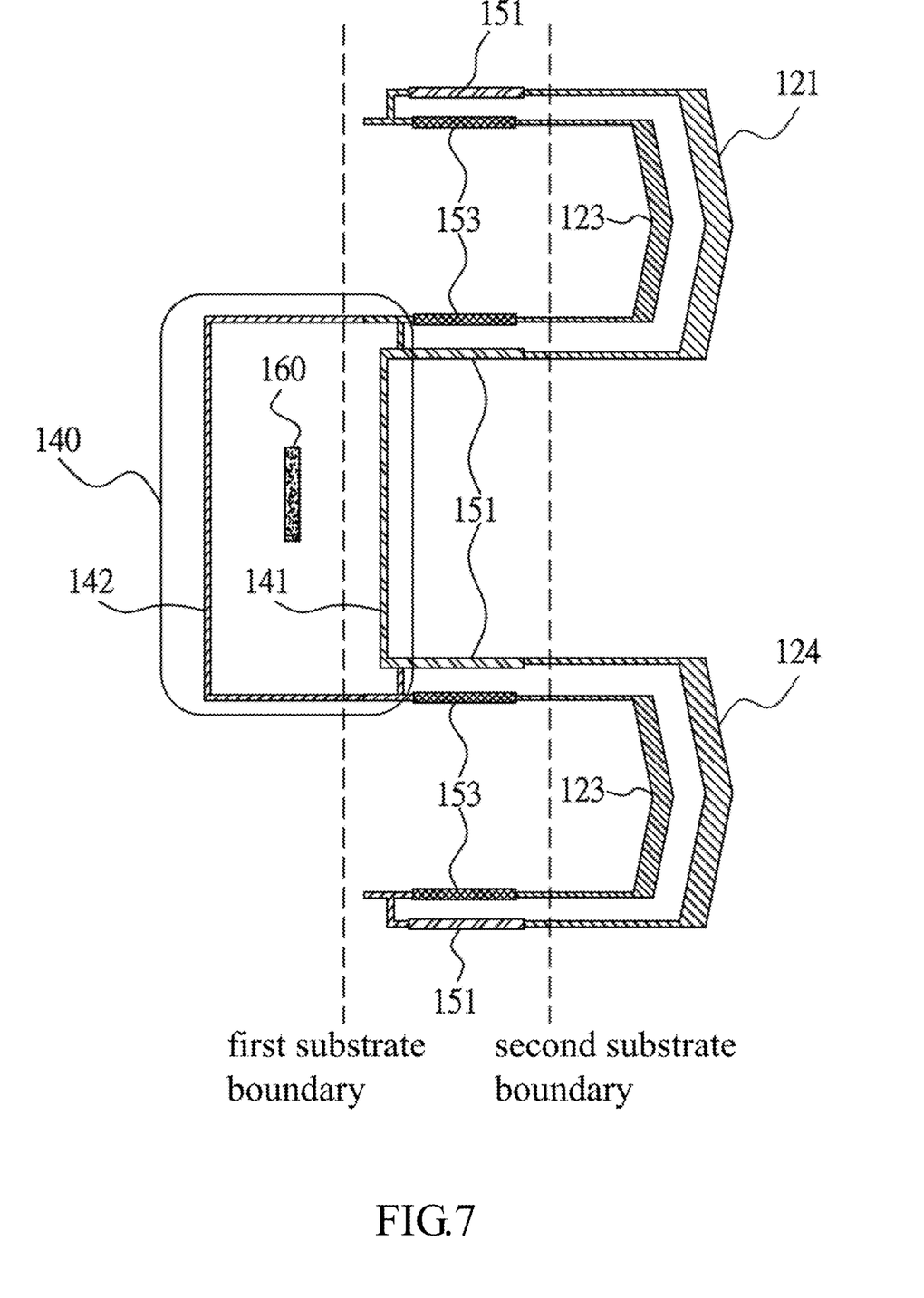
FIG. 7 is a schematic design view showing the type B trace of the display panel working in conjunction with the trace of the flexible circuit board according to an embodiment of this disclosure.

FIG. 7 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a first drive line portion 121, a third drive line portion 123 and a fourth drive line portion 124 disposed in the wiring area of the first substrate; a flexible circuit board 140 including a first wire 141 and a second wire 142, wherein the second wire 142 is connected to the first wire 141 in parallel to form the parallel wires; and a first interface unit 151 electrically coupling the first drive line portion 121 and the fourth drive line portion 124 to the virtual bit interface units 153. The third drive line portions 123 are respectively electrically coupled to the virtual bit interface units 153 to form the parallel circuits with the first drive line portion 121 and the fourth drive line portion 124, respectively.

Figure 8:
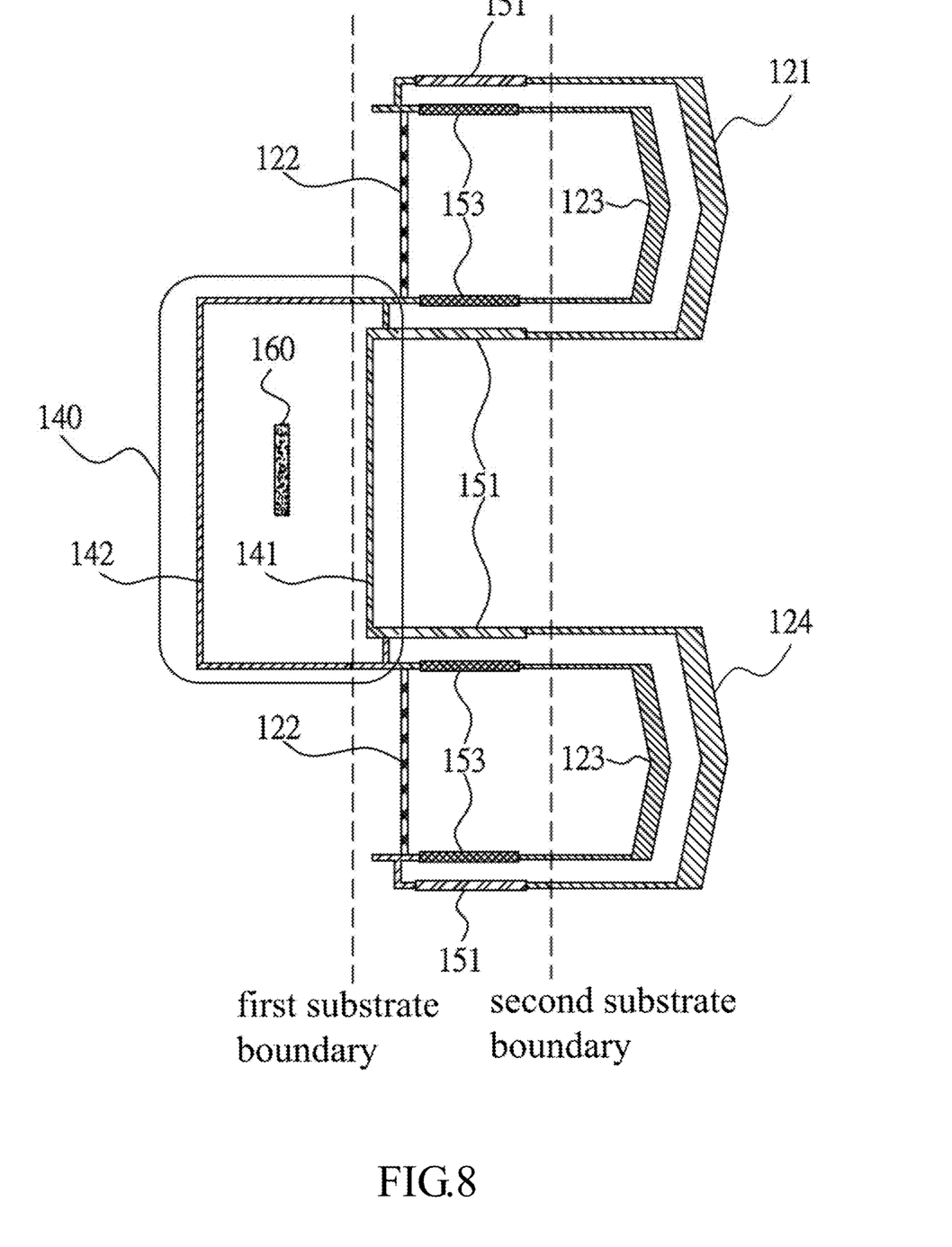
FIG. 8 is a schematic design view showing the type B trace of the display panel working in conjunction with the trace of the flexible circuit board according to an embodiment of this disclosure.

FIG. 8 is a schematic design view showing the type B trace of the display panel working in conjunction with the trace of the flexible circuit board according to an embodiment of this disclosure. In one embodiment of the disclosure, a display panel includes: a first substrate including a display area and a wiring area surrounding the display area, wherein a plurality of active switches and a plurality of pixel units are disposed on the display area of the first substrate, and the pixel units are coupled to the active switches, respectively; a first drive line portion 121 and a fourth drive line portion 124 disposed in the wiring area; and a flexible circuit board 140 including a first wire 141 and a second wire 142, wherein the second wire 142 is connected to the first wire 141 in parallel to form the parallel wires. The first wire 141 is electrically coupled to the first drive line portion 121 and the fourth drive line portion 124. The first drive line portion 121 and the fourth drive line portion 124 are electrically coupled to the second drive line portion 122 and the virtual bit interface unit 153 through the first interface unit 151, respectively. The second drive line portion 122 is electrically coupled between the virtual bit interface units 153. The third drive line portion 123 is electrically coupled to the virtual bit interface units 153 to form the parallel circuits with the first drive line portion 121 and the fourth drive line portion 124, respectively.

Figure 9:
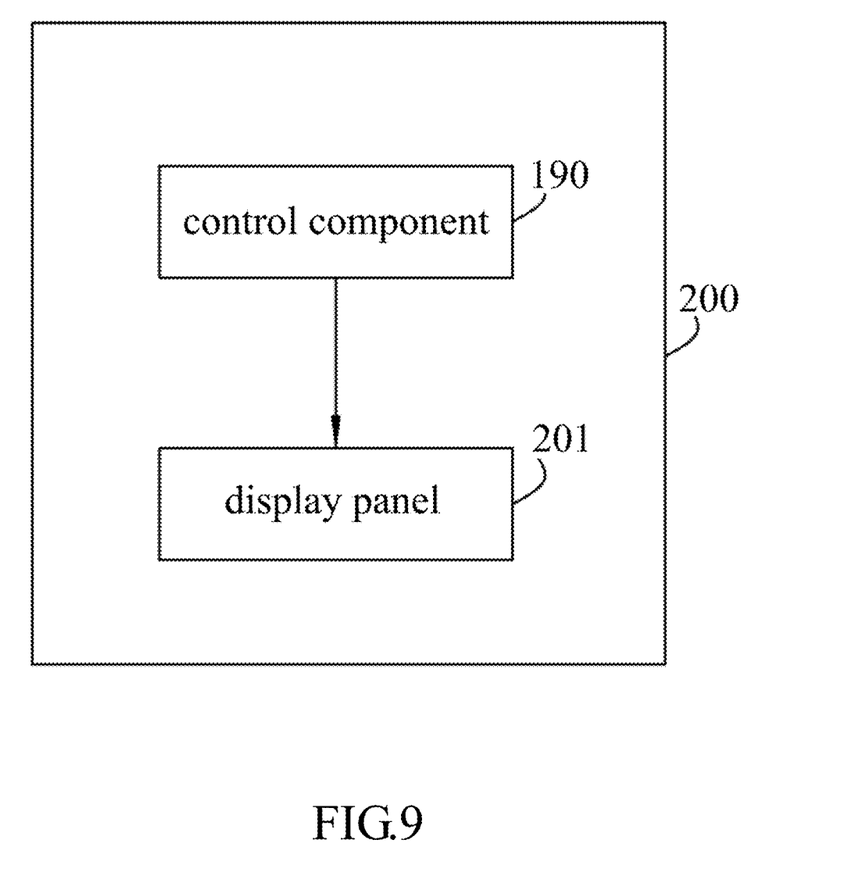
FIG. 9 is a schematic architecture view showing a display device according to an embodiment of this disclosure.

FIG. 9 is a schematic architecture view showing a display device according to an embodiment of this disclosure. Referring to FIGS. 9 and 2 to 8 concurrently, the display device 200 according to an embodiment of this disclosure includes: a control component 190 transmitting the common voltage, the drive power and the work signal through the transmission wires, and the control component 190 includes, for example but without limitation to, the above-mentioned timing controller, the source driving unit 104 and the gate driving unit 105; and a display panel 201, which includes any one of the display panels in the foregoing embodiments.

In some embodiments, the display panel of this disclosure can be, for example, a liquid crystal display panel, but this disclosure is not limited thereto. The display panel of this disclosure can also be an OLED display panel, a W-OLED display panel, a QLED display panel, a plasma display panel, a curved display panel, or any other kinds of display panels.

This disclosure can decrease the resistance value of the type B trace of the WOA in the narrow border, enhancing the product quality and the product reliability, and lengthening the lifetime.

The terms "in some embodiments" and "in various embodiments" are used repeatedly. The terms generally do not refer to the same embodiment; but it may also refer to the same embodiment. The words "include", "possess" and "comprise" are synonyms, unless its contexts show other meanings.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
    a first substrate including a display area and a wiring area, wherein a plurality of active switches and a plurality of pixel units are disposed on the display area of the first substrate, and the pixel units are coupled to the active switches, respectively;
    a second substrate disposed opposite the first substrate;
    a first drive line portion disposed in the wiring area of the first substrate and including a plurality of first circuit leads;
    a second drive line portion disposed in the wiring area of the first substrate and including a plurality of second circuit leads; and
    a first interface unit disposed between the first drive line portion and the second drive line portion;
    wherein the first interface unit connects the first circuit leads to the second circuit leads, respectively, and the second drive line portion is electrically coupled to the first drive line portion to form a parallel circuit, wherein the second drive line portion is electrically coupled to a plurality of virtual bit interface units and the first interface unit.

2. The display panel according to claim 1, wherein the second drive line portion is electrically coupled to the first drive line portion through a single layer metal wiring or a dual layer metal wiring.

3. The display panel according to claim 1, further comprising a third drive line portion electrically coupled to the virtual bit interface units to form a parallel circuit with the first drive line portion.

4. The display panel according to claim 3, wherein the virtual bit interface units are provided by way of a single layer metal wiring or a dual layer metal wiring.

5. The display panel according to claim 1, wherein the first circuit leads are connected to a drive chip.

6. The display panel according to claim 5, wherein the drive chip is a source drive chip.

7. The display panel according to claim 5, wherein the drive chip is a gate drive chip.

8. The display panel according to claim 1, further comprising:
    a fourth drive line portion disposed in the wiring area of the first substrate; and
    a flexible circuit board including a first wire electrically coupled to the first drive line portion and the fourth drive line portion.

9. The display panel according to claim 8, wherein the flexible circuit board further includes a second wire, and the second wire and the first wire are connected in parallel to form a parallel wire.

10. The display panel according to claim 9, wherein the second wire is electrically coupled to the virtual bit interface units and the first interface unit.

11. The display panel according to claim 8, wherein the flexible circuit board is a flexible printed circuit film or a flexible printed circuit board.

12. The display panel according to claim 3, further comprising:
    a fourth drive line portion disposed in the wiring area of the first substrate; and
    a flexible circuit board including a first wire and a second wire, wherein the first wire and the second wire are connected in parallel to form a parallel circuit, and the first interface unit electrically couples the first drive line portion and the fourth drive line portion to the virtual bit interface units.

13. The display panel according to claim 12, wherein the third drive line portion is electrically coupled to the virtual bit interface units to form parallel circuits with the first drive line portion and the fourth drive line portion.

14. The display panel according to claim 3, further comprising:
a fourth drive line portion disposed in the wiring area of the first substrate; and
a flexible circuit board including a first wire and a second wire, wherein the first wire and the second wire are connected in parallel to form a parallel circuit, the first wire is electrically coupled to the first drive line portion and the fourth drive line portion, the first interface unit electrically couples the first drive line portion and the fourth drive line portion to the second drive line portion and the virtual bit interface units, and the second drive line portion is electrically coupled between the virtual bit interface units.

15. The display panel according to claim 14, wherein the third drive line portion is electrically coupled to the virtual bit interface units to form a parallel circuit with the first drive line portion and the fourth drive line portion.

16. A display panel, comprising:
a first substrate including a display area and a wiring area, wherein a plurality of active switches and a plurality of pixel units are disposed on the display area of the first substrate, and the pixel units are coupled to the active switches, respectively;
a second substrate disposed opposite the first substrate;
a first drive line portion disposed in the wiring area of the first substrate and including a plurality of first circuit leads, wherein the first circuit leads are extendingly arranged in a direction toward an edge of the first substrate;
a second drive line portion disposed in the wiring area of the first substrate and including a plurality of second circuit leads, wherein the second circuit leads face and extend toward an inside of the first substrate and are arranged in a direction opposite to the first circuit leads;
a first interface unit connected to the first circuit leads; and
a virtual bit interface unit connected to the second circuit leads;
wherein the first interface unit connects the virtual bit interface unit, and the second drive line portion is electrically coupled to the first drive line portion to form a parallel circuit;
the first drive line portion further comprises a first pair of bit marks connected to the first circuit leads, and the second drive line portion further comprises a second pair of bit marks connected to the second circuit leads; and
the first interface unit and the second drive line portion are electrically coupled to the first drive line portion by way of a single layer metal wiring or a dual layer metal wiring.

17. The display panel according to claim 16, wherein a material of the first pair of bit markers and the second pair of bit markers is selected from a group consisting of aluminum, molybdenum, chromium and alloys thereof.

18. The display panel according to claim 16, wherein a material of the first interface unit and the virtual bit interface unit is selected from a group consisting of aluminum, molybdenum, chromium and alloys thereof.

19. A display device, comprising:
a control component; and
a display panel connected to the control component and comprising:
a first substrate including a display area and a wiring area, wherein a plurality of active switches and a plurality of pixel units are disposed on the display area of the first substrate, and the pixel units are coupled to the active switches, respectively;
a second substrate disposed opposite the first substrate;
a first drive line portion disposed in the wiring area of the first substrate and including a plurality of first circuit leads;
a second drive line portion disposed in the wiring area of the first substrate and including a plurality of second circuit leads; and
a first interface unit disposed between the first drive line portion and the second drive line portion;
wherein the first interface unit connects the first circuit leads to the second circuit leads, respectively, and the second drive line portion is electrically coupled to the first drive line portion to form a parallel circuit, wherein the second drive line portion is electrically coupled to a plurality of virtual bit interface units and the first interface unit.

* * * * *